US007557679B2

(12) United States Patent
Martin et al.

(10) Patent No.: US 7,557,679 B2
(45) Date of Patent: Jul. 7, 2009

(54) SEALED MICROWAVE FEEDTHROUGH

(75) Inventors: Siegbert Martin, Oppenweiler (DE); Klaus Junger, Almersbach im Tal (DE); Axel Mayr, Backnang (DE)

(73) Assignee: Ericsson AB, Stockholm (SE)

( * ) Notice: Subject to any disclaimer, the term of this patent is extended or adjusted under 35 U.S.C. 154(b) by 120 days.

(21) Appl. No.: 10/504,499

(22) PCT Filed: Feb. 6, 2003

(86) PCT No.: PCT/IB03/00786

§ 371 (c)(1),
(2), (4) Date: May 11, 2005

(87) PCT Pub. No.: WO03/069724

PCT Pub. Date: Aug. 21, 2003

(65) Prior Publication Data

US 2005/0206473 A1 Sep. 22, 2005

(30) Foreign Application Priority Data

Feb. 15, 2002 (DE) ................................ 102 06 629

(51) Int. Cl.
*H03H 5/00* (2006.01)

(52) U.S. Cl. .......................... 333/245; 333/260; 333/33

(58) Field of Classification Search ................. 333/245, 333/33, 260, 254

See application file for complete search history.

(56) References Cited

U.S. PATENT DOCUMENTS

| | | | | |
|---|---|---|---|---|
| 4,951,011 | A | | 8/1990 | Heckaman |
| 5,333,095 | A | * | 7/1994 | Stevenson et al. ........... 361/302 |
| 5,430,257 | A | | 7/1995 | Lau |
| 5,936,494 | A | | 8/1999 | Pollock |

FOREIGN PATENT DOCUMENTS

| | | | |
|---|---|---|---|
| DE | 63/2289 | | 4/1963 |
| DE | 43 41 052 | A1 | 6/1995 |
| DE | 44 05 855 | A1 | 8/1995 |
| DE | 195 16 479 | A1 | 11/1996 |
| DE | 195 42 525 | C2 | 12/1997 |
| DE | 199 48 331 | A1 | 5/2000 |
| EP | 0 599 316 | B1 | 2/1998 |

* cited by examiner

*Primary Examiner*—Stephen E Jones
(74) *Attorney, Agent, or Firm*—Kirschstein, et al

(57) ABSTRACT

A feedthrough for feeding a microwave signal through a wall of a casing comprises a signal waveguide having at least two portions having different cross-sections. The portion having the smaller cross-section is filled with plastically-deformable dielectric material which, under the action of pressure and heat, is bonded to the walls of the portion in which it is located. The dimensions of the portion are such as to provide an impedance match with the adjacent portions. An antenna couples electromagnetic energy between the waveguide and a strip transmission line. A metal cap seals the end of the waveguide and screens the antenna.

13 Claims, 3 Drawing Sheets

SEALED MICROWAVE FEEDTHROUGH

The present invention relates to a sealed feedthrough for a microwave or radio frequency signal.

Various designs of such feedthroughs are known. A common design is a coaxial feedthrough as shown in FIG. 5. In a feedthrough of this type, a glass body 1 is fused into a round bore of a wall 3, through which a metallic conductor 2 conducting the signal to be fed through extends coaxially. This type of feedthrough is appropriate for low frequencies. At high frequencies, inevitable deviations of the position of the conductor 2 from an exactly coaxial position lead to considerable scatter of the transmission behavior of this type of feedthrough. This makes such a feedthrough inappropriate for mass production for radio frequencies.

Further, hollow waveguide feedthroughs of the type shown in FIG. 6 are known, in which the bore extending through wall 3 has a shoulder 4 on which a microwave-transparent disc 5 made from a dielectric material such as mica or glass is laid and is welded to the wall of the bore using a glass solder 6. Upon a welding, a solder groove is formed which impairs the microwave behavior. A useful application range for feedthroughs of this type is for signal frequencies of less than 15 GHz.

A third type of feedthrough shown in FIG. 7 allows for hermetically sealing a hollow waveguide of constant cross-section. For this purpose, a glass disc 5 made to measure for the particular hollow waveguide is provided with a metallization 7 at its circumference and is fixed by means of metallic solder that enters the small gap between the waveguide wall and the metallization 7. In a feedthrough of this type, it is difficult to place the glass disc 5 so that it is uniformly surrounded by solder at all sides; moreover, the solder must be dispensed very carefully in order to ensure, on the one hand, that it surrounds the complete circumference of the glass disc and that, on the other hand, that there are no solder residues protruding over the glass disc 5 in longitudinal direction of the hollow waveguide, since these might impair its transmission behavior.

A housing for a device in which such a sealed microwave feedthrough is used generally comprises further feedthroughs for a supply voltage of the device and/or for signals having a lower frequency than the one fed through at the microwave feedthrough. In general, these other feedthroughs must also be sealed. For these signals or supply voltages, feedthroughs of the type described above with reference to FIG. 5 are commonly used. Their manufacture cannot be combined with that of a feedthrough of the second or third type appropriate for higher frequencies, because while in case of a coaxial feedthrough, the entire glass body must be heated to a temperature at which the glass becomes plastic and fits closely to the walls of the bore, in a feedthrough of the second type, only the glass solder must melt, but not the disc, and also in a feedthrough of the third type, only the metallic solder is intended to melt but not the glass body. The inevitably different processing steps for the manufacture of the various types of feedthrough makes the production of such casings laborious and expensive.

Objects of the present invention are to provide a microwave feedthrough which is simple and economic in manufacture and which is appropriate for high signal frequencies, a sealed casing for a microwave circuit and a method for their manufacture.

A feedthrough in accordance with the invention is particularly easy to manufacture by inserting into the second portion of the signal channel a disc made of a plasticly-deformable material manufactured to the size of the second portion and making it plastic between dies, in particular by heating it. The dies may have a larger cross-section than said second portion, so that they cannot enter into the second portion itself but come to rest at an abutment defined by the shape of the signal channel. Since the dies prevent the material of the disc from passing the abutment when it is in its plastic state, the uncontrolled escape of material and thus the formation of parasitic structures of poorly-controllable shape at the edge of the disc, e.g. similar to the solder grooves of the feedthrough type of FIG. 6, is prevented.

In order to prevent a heavy stress on the dielectric material of the disc at resolidification which might induce the material or its connection to the walls of the signal channel to break, the second portion preferably has a cross-section which is free from sharp angles. Appropriate cross-sectional shapes are e.g. an ellipse or a rectangle having rounded corners.

The first portion of the signal channel generally is a hollow waveguide having a defined characteristic impedance. By an appropriate choice of the length of the second portion as a function of the cross-sectional areas of the first and second portions and of the dielectric constant of the material of the disc, the characteristic impedance of the second portion may be matched with that of the first.

The end of the second portion of the signal channel which is remote from the first portion may be flush with the surface of a wall through which the feedthrough extends; alternatively, a third portion having a larger cross-section than the second portion may be provided connected to the second portion.

Preferably, in this third portion an antenna is arranged for sending or receiving the microwave signal transmitted in the signal channel. In particular, this antenna may be provided on a dielectric substrate extending across the third portion.

Where the feedthrough is employed in a device casing, the antenna will generally be inside the device. In order to prevent uncontrolled exposure of circuitry of the device to the microwave signal, the third portion is preferably delimited by a cap which is opaque to the microwave signal.

The portions of the signal channel preferably meet at shoulders oriented transversely to the propagation direction of the microwave signal. These shoulders may serve as abutments for dies while clamping and heating the glass body.

Further features and advantages of the invention will become apparent from the following description of embodiments.

Referring to the appended Figures.

Figure 1:
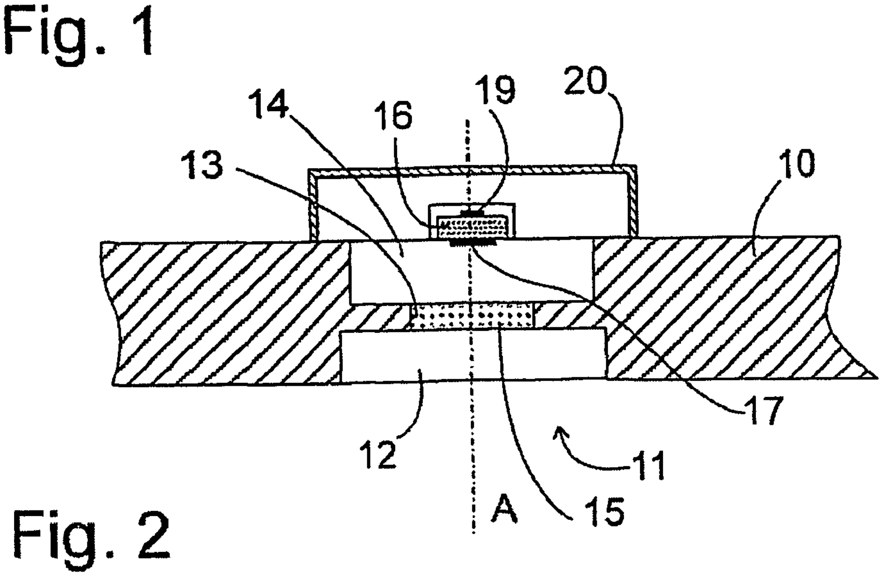
FIG. 1 is a cross-section through a feedthrough according to the invention in a first plane parallel to the signal propagation direction.

FIG. 1 shows a section through a wall 10 of a casing for a device that generates and/or processes microwave signals. A signal channel 11 for a microwave signal extends through the wall and is divided into three portions 12, 13, 14, each having different cross-sections, which follow one upon the other from the outside (bottom side in the Fig.) of the casing to its inside. The cross-sectional area of the intermediate, second portion 13 is less than that of the neighboring portions 12, 14, and the second portion 13 is snugly filled by a glass body 15 which is in intimate, sealed contact with the metallic side walls of the second portion 12.

Figure 2:
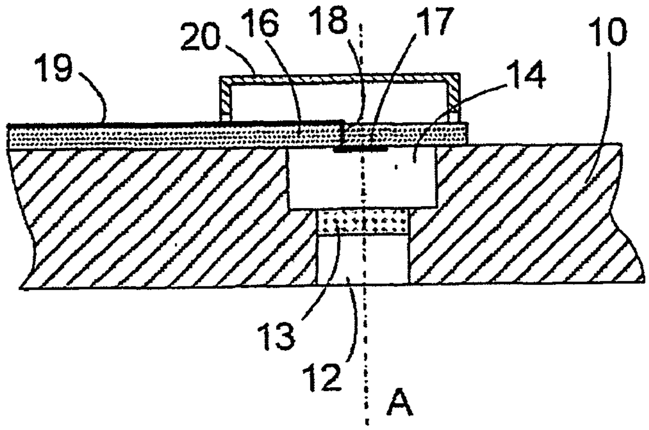
FIG. 2 is a second section through the feedthrough in a plane perpendicular to the plane of FIG. 1.

A strip 16 of dielectric material, in particular a circuit board strip resting on the inner side of wall 10, protrudes into the free cross-section of the third portion 14 from its edge. For stability reasons, it rests at the wall 10 surface at both sides of the portion 14, as shown in FIG. 2.

At its bottom surface, facing the signal channel 11, the circuit board strip 16 has a thin metal layer forming an antenna 17. It is connected by a via 18 to a microstrip conductor 19 formed at the upper surface of strip 16 which is provided for transmitting a microwave signal incident by signal channel 11 to a circuit (not shown) inside the casing or to radiate a signal generated by the circuit via signal channel 11.

A metal cap 20 is placed over antenna 17 and signal channel 11 in order to prevent an uncontrolled propagation of the microwave signal received or radiated by antenna 17 inside the casing. The circuit board strip 16 extends through marginal cut-outs of cap 20.

Figure 3:
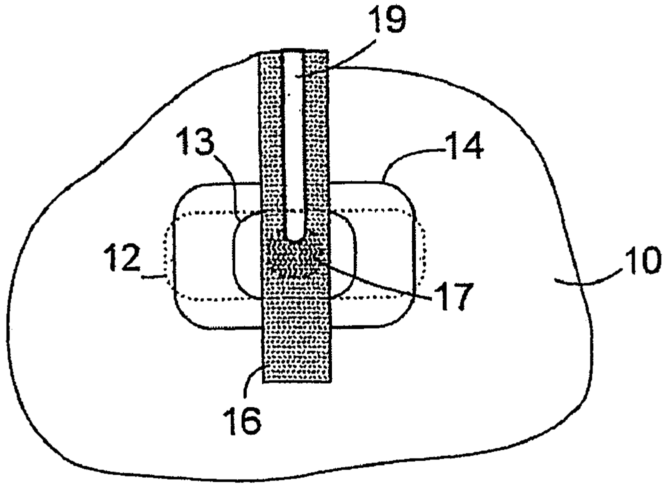
FIG. 3 is a top view of the feedthrough, seen from inside the casing, in which the cap placed upon it has been omitted.

FIG. 3 shows a top view of the microwave feedthrough, seen from inside the wall 10, omitting cap 20. The cross-section of the first portion 12 which would not be visible in this view is represented as a dashed line.

All portions 12, 13, 14 have a cross-section in the shape of a rectangle having rounded corners. In this example, the radius of curvature of the corners is about 30% of the length of the short edge of the rectangle; values between approx. 15 and 50% are possible.

The longer edge of the cross-section (the horizontal one in FIG. 3) is pronouncedly shorter in the second portion 13 than in the first portion 12; the lengths of the shorter edges are not or not essentially different. The proportions of the cross-sectional dimensions are determined on the one hand by the requirement that, in the portion 13, no other waveguide modes should be able to propagate than those which also occur in the first portion 12 and in a continuation hollow waveguide connected to it, respectively. Particularly if only the TE10 wave is able to propagate in these, it is necessary to reduce the longer edge of the second portion 13 filled by the glass body 15 in order to suppress higher modes.

An impedance matching of the two portions 12, 13 having different cross-sections is possible by appropriately choosing the length of the second portion 13. The calculations necessary for finding the appropriate length are familiar to a microwave expert and are therefore not specifically described here.

Figure 4A:
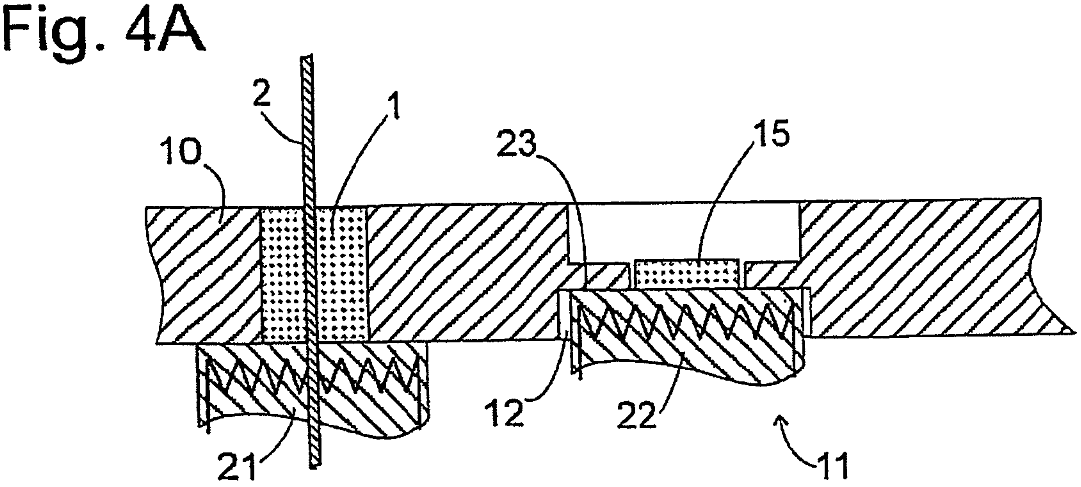
FIGS. 4A, 4B show steps of manufacturing a casing having a feedthrough according to the invention.
Figure 4B:
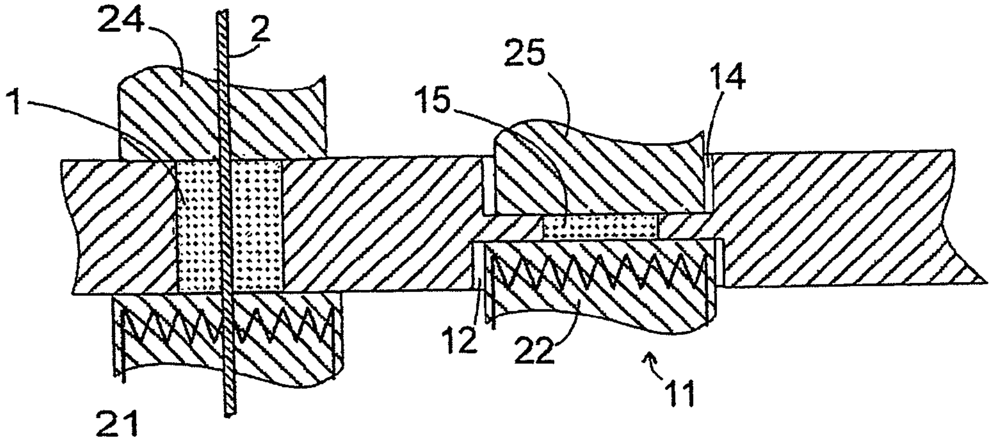
Figure 5:
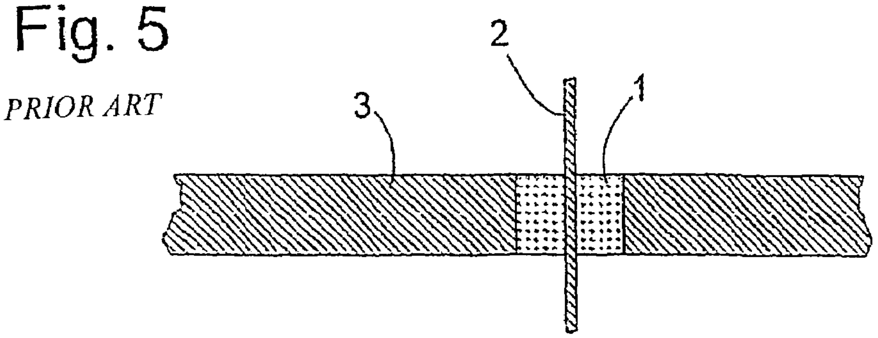
Fig. 5 PRIOR ART
FIGS. 5 to 7, already discussed, illustrate known types of sealed feedthroughs.
Figure 6:
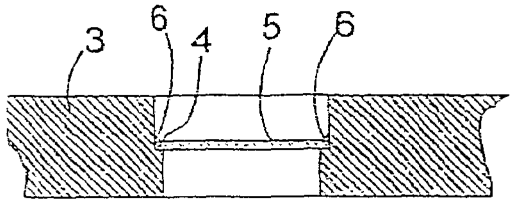
Fig. 6 PRIOR ART
Figure 7:
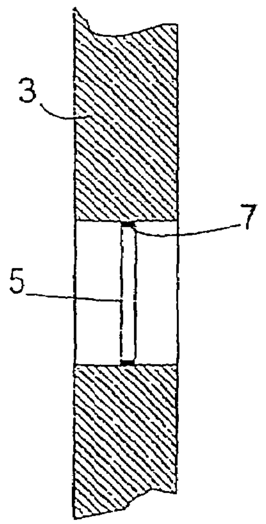
Fig. 7 PRIOR ART

FIGS. 4A, 4B show sections through a wall 10 of a device casing having both a sealed microwave feedthrough of the type shown in FIGS. 1 to 3 and a coaxial feedthrough of the type shown in FIG. 5 for supply voltages and/or signals of relatively low frequencies, in two phases of the manufacture of the casing.

In the first manufacturing step, glass bodies 1 and 15, respectively, are loosely fitted into a bore and into the second portion 13 of signal channel 11, respectively. The glass bodies 1, 15 are made to measure for the bore and the second portion 13, respectively, so that they can be fitted into the bore and the portion 13, respectively, with minimum cross-sectional clearance and a similarly small projection in an axial direction.

In this stage, the glass body 1 is supported by a die 21 resting closely at the outside of the wall 10 and having an insertion bore for the conductor 2 of the coaxial feedthrough.

A die 22 is inserted into the first portion 12 of the signal channel 11; it has a plane surface closely resting at a shoulder 23 which is arranged transversely to the axis A and defines the transition from the first portion 12 to the second portion 13 of the signal channel.

After inserting the glass bodies 1, 15, two further dies 24, 25 are brought into position at the glass bodies 1 and 15, respectively, from above, in order to heat and clamp these. By heating the glass bodies 1, 15 clamped between the dies to a temperature of approx. 1000° C., these become plastic and, under the pressure of the dies, fit intimately at the walls of the bore and the second portion 13, respectively. In this way, the die 25 comes to abut at a shoulder 26 separating the second portion 13 from the third portion 14.

Due to the rounded corners of the cross section shape of portion 13, stress occurring in the glass body 15 upon cooling is prevented from concentrating at individual points of the glass body 15 and from causing fissures or a separation from the wall of the signal channel.

In this way, both types of feedthrough, the one according to the invention and the conventional coaxial feedthrough, may simply and economically be formed in the same processing step.

The invention claimed is:

1. A feedthrough for a microwave signal, comprising: a signal channel sealedly closed by a body made of a plasticly-deformable dielectric material transparent to the microwave signal, the signal channel having at least a first portion and a second portion adjacent to the first portion, the second portion having a smaller cross-section than that of the first portion, the cross-section of the second portion being in a shape of an ellipse or of a rectangle having rounded corners, the second portion being filled with the dielectric material, the body being formed by heating and pressurizing the dielectric material in the second portion.

2. The feedthrough according to claim 1, in that the dielectric material is a glassy material which is plastic in a hot state.

3. The feedthrough according to claim 1, in that the second portion has a cross-section which is devoid of pointed corners.

4. The feedthrough according to claim 1, in that the second portion and at least one portion adjacent thereto meet at a shoulder arranged transversely with respect to a propagation direction of the microwave signal.

5. The feedthrough according to claim 1, in that the first portion is a hollow waveguide.

6. The feedthrough according to claim 5, in that a characteristic impedance of the second portion filled with the dielectric material is the same as that of the hollow waveguide.

7. The feedthrough according to claim 1, in that the signal channel comprises a third portion adjacent to the second portion, the third portion having a larger cross-section than that of the second portion.

8. The feedthrough according to claim 7, in that the third portion is delimited by a cap which is opaque to the microwave signal.

9. The feedthrough according to claim 7, in that an antenna is located in the third portion.

10. The feedthrough according to claim 9, in that the antenna is located on a dielectric substrate extending across the third portion.

11. A casing for a microwave circuit, comprising a feedthrough for a microwave signal, the feedthrough comprising: a signal channel sealedly closed by a body made of a plasticly-deformable dielectric material transparent to the microwave signal, the signal channel having at least a first portion and a second portion adjacent to the first portion, the second portion having a smaller cross-section than that of the first portion, the cross-section of the second portion being in a shape of an ellipse or of a rectangle having rounded corners, the second portion being filled with the dielectric material, the body being formed by heating and pressurizing the dielectric material in the second portion.

12. The casing according to claim 11, wherein the feedthrough comprises at least one glass-sealed coaxial feedthrough.

13. The casing according to claim 12, in that the dielectric material and the glass used for sealing the coaxial feedthrough have the same composition.

* * * * *